US006795514B2

(12) United States Patent
Gresham

(10) Patent No.: US 6,795,514 B2
(45) Date of Patent: Sep. 21, 2004

(54) INTEGRATED DATA CLOCK EXTRACTOR

(75) Inventor: Paul Alan Gresham, Arnprior (CA)

(73) Assignee: Zarlink Semiconductor Inc., Kanta (CA)

( * ) Notice: Subject to any disclaimer, the term of this patent is extended or adjusted under 35 U.S.C. 154(b) by 745 days.

(21) Appl. No.: 09/794,644

(22) Filed: Feb. 27, 2001

(65) Prior Publication Data

US 2001/0018751 A1 Aug. 30, 2001

(30) Foreign Application Priority Data

Feb. 28, 2000 (GB) .............................................. 0004672

(51) Int. Cl.$^7$ ................................................ H04L 7/00
(52) U.S. Cl. ...................................... 375/354; 375/355
(58) Field of Search ................................ 375/354, 355, 375/259, 326, 219, 371, 360, 374; 713/401; 327/156, 161, 158; 360/51

(56) References Cited

U.S. PATENT DOCUMENTS

| 4,338,569 A | 7/1982 | Petrich |
| 4,805,195 A | 2/1989 | Keegan |
| 5,463,337 A | 10/1995 | Leonowich |
| 5,642,386 A | 6/1997 | Rocco, Jr. |
| 5,963,069 A | 10/1999 | Jefferson et al. |
| 6,044,122 A | * 3/2000 | Ellersick et al. ............ 375/360 |
| 6,125,157 A | * 9/2000 | Donnelly et al. ........... 375/371 |
| 6,421,784 B1 | * 7/2002 | Chu et al. ................... 713/401 |

FOREIGN PATENT DOCUMENTS

EP 0156375 10/1985

OTHER PUBLICATIONS

Search Report of Great Britain Application No. 0004672.2.

* cited by examiner

Primary Examiner—Stephen Chin
Assistant Examiner—Ted Wang

(57) ABSTRACT

A circuit for extracting a data clock signal from an input data stream, comprising a programmable delay element for receiving an arbitrary clock signal, delaying the arbitrary clock signal by a variable programmable amount and in response generating an extracted data clock signal, and a clock phase detector for comparing logic level transitions of the input data stream with transitions of the extracted data clock signal and in response generating a delay adjust signal for defining the variable programmable amount of delay such that the transitions of the input data stream are substantially aligned with the transitions of the arbitrary clock signal.

7 Claims, 7 Drawing Sheets

INTEGRATED DATA CLOCK EXTRACTOR

FIELD OF THE INVENTION

This invention relates in general to digital signal transmission, and more particularly to an integrated data clock extractor for regenerating a data clock associated with a stream of data that can then be used to sample the data stream.

BACKGROUND OF THE INVENTION

It is well known in traditional digital communication systems to perform clock extraction by means of an external device such as the TRU050-GACGA/20.48 clock extractor available from AT&T, LUCENT and VECTRON. This prior art circuit works very well, but is expensive and requires separate handling and assembly onto data encode/decode circuit boards.

Other well-known phase lock loop circuits are available, but they too have a negative impact on cost, board area and connectivity. They are also typically analog in nature, and do not lend themselves to easy integration into digital CMOS ASICs. Also, many traditional phase lock circuits require a regular periodic input, whereas a data stream is not a regular periodic signal.

The following prior art references disclose various types of programmable delay elements for synchronizing a clock to a data stream:

EP 0 156 375 (Honeywell)
U.S. Pat. No. 5,642,386 (Rockwell)
U.S. Pat. No. 4,805,195 (Keegan)
U.S. Pat. No. 4,338,569 (Petrich)

EP 0156375 sets forth a circuit for accurately selecting a specific pulse train from a sequence of similar, but not identical pulse trains. An up/down counter and programmable delay line are set forth. However, it would not be possible to integrate the disclosed delay line inside a digital CMOS gate array or standard cell array while still obtaining consistent delay values. This is because the actual circuit delays can vary from one half to two times the nominal values as a result of variations in process, temperature and voltage. The design of the delay line in this prior art system requires an exact amount of delay be established so that the total delay through all elements is exactly one clock cycle which, is indicated above, is not plausible to accomplish within a digital CMOS gate array or standard cell array as a result of variations in delay from process, temperature and voltage.

U.S. Pat. No. 5,642,386 sets forth a clock/data extraction technique utilizing multiple programmable delay elements arranged in series with a common control input for each element. Data bit times are framed in the input data stream within a number of fixed tap points between each delay line. Control logic is then utilize to identify the statistical midpoint of the framed bit times and which tap point is closest to the midpoint. The control logic uses a multiplexer to select the desired tap point as a stable data sample point. There is no suggestion of using a delay line for incrementally adjusting the phase of an input clock to produce an output data recovery clock whose positive edge lines up exactly with reoccurring data transitions on the bit boundaries of the data stream, as discussed in greater detail below with reference to the present invention.

U.S. Pat. No. 4,805,195 discloses a circuit to distribute clock signals in a multi-board system by means of programmable delay elements. However, there is no input data stream, nor any specific means of detecting a desired delay setting. Consequently there is no extracted data stream. Furthermore the specific delay elements set forth in this prior art document are incapable of integration into digital CMOS gate arrays because specific delays are recited which, as discussed above in connection with EP 0 156 375, renders impossible the integration of such delay elements into a CMOS gate array or standard cell array.

U.S. Pat. No. 4,338,569 discloses a configuration which ceases to operate properly if its up/down counter rolls over because a number of data bits stored in the programmable delay line would be jumped over resulting in a data error in the phase corrected output. Moreover, since the total delay in the programmable delay is required to store exactly one clock period. Such a delay is not capable of integration within a CMOS gate array or standard cell array, for the reasons discussed above in connection with EP 0 156 375.

SUMMARY OF THE INVENTION

According to the present invention, a data clock extractor is integrated into the same ASIC as the rest of the data encode/decode hardware, without the need of any external hardware. This ASIC contains bit decoding and framing hardware as well as the clock extraction hardware, thereby substantially reducing cost of the function and required PCB area when compared to prior art external clock extraction devices. Also, the circuit is designed to function in exclusively a digital environment, in contrast with prior art phase lock loop circuits. All signaling uses "logic 1" and "logic 0" type logic levels which are consistent with current digital CMOS design techniques.

The circuit according to the present invention provides a data clock extraction function by taking an arbitrary clock signal of the correct frequency, and applying a variable amount of delay to this clock signal, so to provide an extracted data clock signal with signal transitions adjusted to be coincident with the data input signal. The two primary components of the circuit according to the present invention are a programmable delay element, and a clock phase detector. In operation, the clock phase detector observes an input data stream, and the current extracted data clock, and makes small incremental changes to a delay adjust input of the programmable delay element, so that the positive transitions of the delayed data clock (i.e. the extracted data clock signal) remain almost co-incident with the positive transitions of the data stream.

In order to integrate the data clock extractor of the present invention into a digital CMOS ASIC, a cycle limit extractor limit is utilized to dynamically adjust for variations in the programmable delay element resulting from process, temperature and voltage, thereby overcoming the shortcomings of the above discussed prior art systems.

BRIEF DESCRIPTION OF THE DRAWINGS

A detailed description of the preferred embodiment is set forth herein below with reference to the following drawings, in which.

DETAILED DESCRIPTION OF THE PREFERRED EMBODIMENT

The circuit of the present invention can be used to extract a data clock from any data stream formatted such that all data transitions occur at exact multiples of the data clock period, and there is a minimum logic transition rate inside the data stream. The circuit is preferably implemented inside of a CMOS gate array, embedded array, standard cell array, or any otherwise digital CMOS integrated circuit. The circuit uses several well-known and well-understood design techniques and circuit configurations that are not described in detail herein in order to preserve the clarity of this disclosure.

Figure 1:
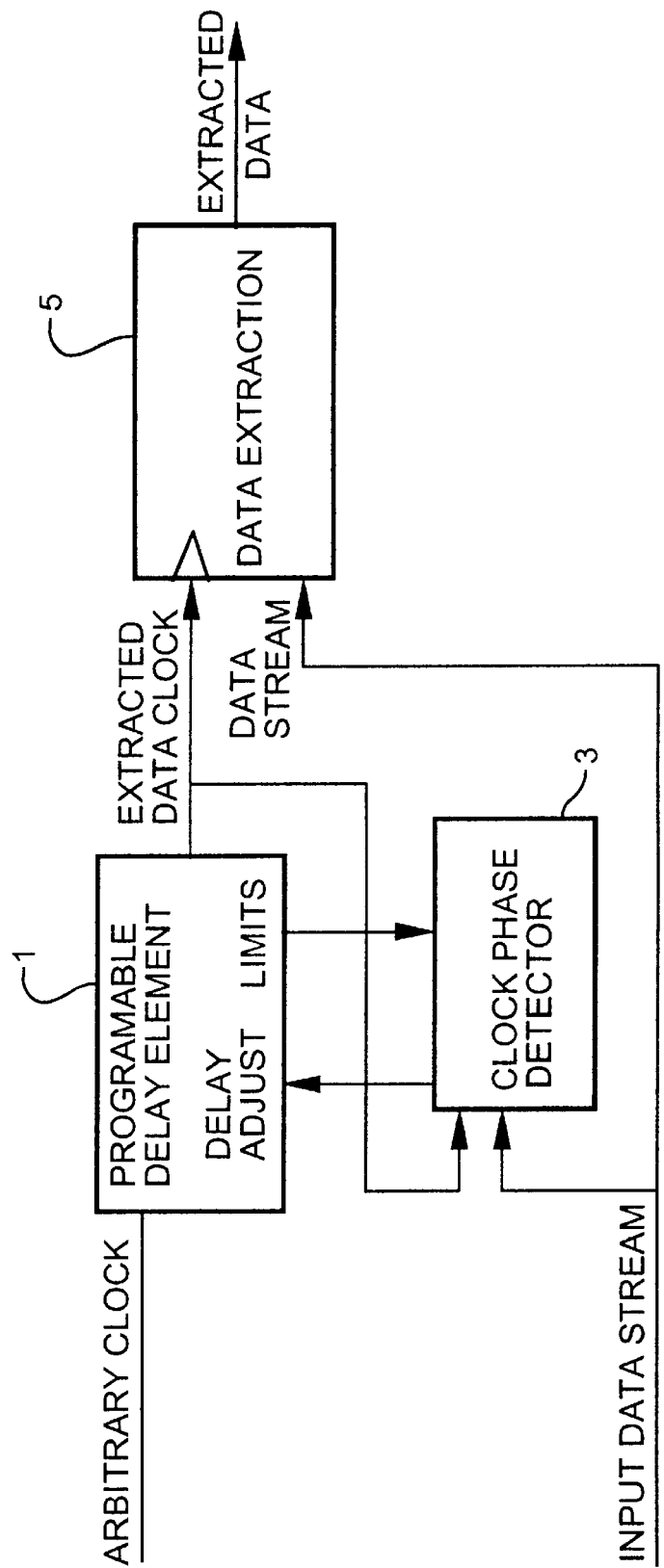
FIG. 1 is a block diagram of a data clock extraction circuit according to the preferred embodiment.

As indicated above, the two primary components of this invention are a programmable delay element 1, and a clock phase detector 3, as illustrated in FIG. 1. The extracted data clock is used as the main clock of a block 5 that samples the input data stream. The data extraction block 5 does not form part of the present invention, although it is almost always part of data extraction hardware. The data extraction block 5 is implemented using well-known techniques.

The programmable delay element 1 provides the data clock extraction function by taking an arbitrary clock signal of the correct frequency, and applying a variable amount of delay to this clock signal, so as to adjust its edge to be coincident with the data input signal. The arbitrary clock input signal can be generated using any number of well-known and well-understood techniques. Most ASIC technology libraries offer crystal oscillator or phase-lock-loop macro cells that may be used to generate the arbitrary clock signal.

In operation, the clock phase detector 3 receives the input data stream, and the current extracted data clock, and makes small incremental changes to the delay adjust input of the programmable delay element 1, so that the positive transitions of the data clock remain almost co-incident with the positive transitions of the data stream.

Figure 2:
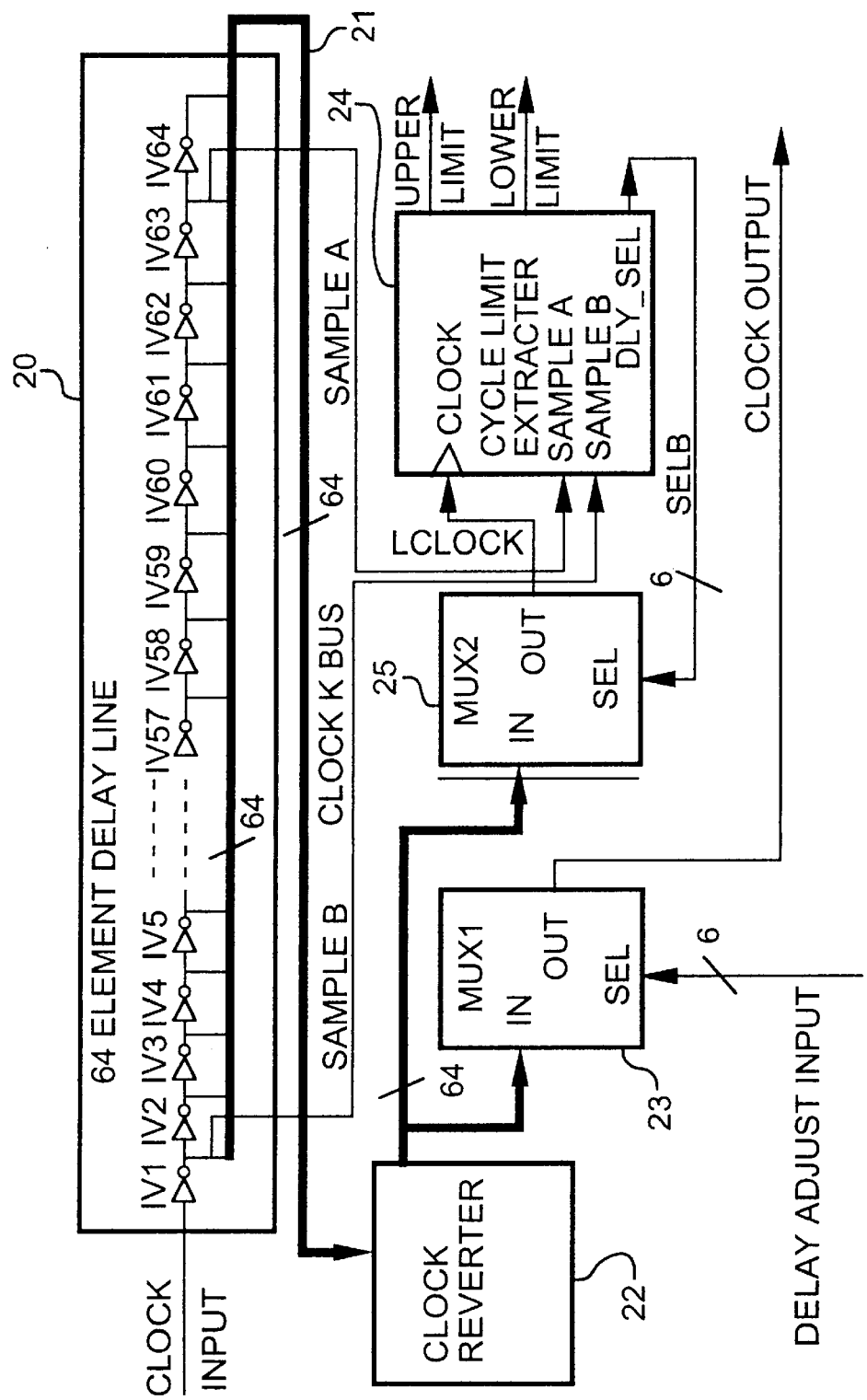
FIG. 2 is a block diagram of a programmable delay element of the circuit in FIG. 1.

A block diagram of the programmable delay element 1 provided in FIG. 2. A 6 bit binary signal is fed into the delay adjust input, and a corresponding signal appears at the clock output that is equal to the clock input, but has been delayed by an amount selected by the delay adjust input. This is achieved by using a delay line 20 to incrementally delay the clock input, a clock bus 21 to tap off all of the incremental delays, a clock reverter 22 to adjust all clock samples on the clock bus to the same logic sense, and a 64 bit to one bit multiplexer 23, MUX1, to select one out of the 64 delayed clock signals.

The function of the cycle limit extractor 24 and the second 64 bit to one bit multiplexer 25, MUX2, (neither of which are in the clock select path), is to determine down-count and up-count modulos, as discussed in greater detail below.

The 64 element delay line 20 comprises individual inverting elements. Inverting elements are used to cancel out any propagation delay difference that may occur between the high-to-low and the low-to-high transitions of the clock as it propagates through each element of the delay line 20. The delay line is tapped at every inverter output, so that a total of 64 taps are provided. These are collected onto the clock bus 21, as illustrated, so that the most significant element of the clock bus is connected to the output of inverter IV1, and the least significant element of the clock bus is connected to the output of inverter IV64. Each of the 64 inverting delay elements, IV1 to IV64, is of identical construction, consisting of a plurality of inverting elements or non-inverting elements connected such that the final output is inverting.

A first objective of the design of delay line 20 is to ensure that the total delay provided by all 64 elements connected together is greater than 1 (one) clock period. This objective can be verified in simulation using minimum (fastest) timing. Typically, allowances must also be made, during the ASIC layout, for the delay line to grow, because the actual delays can be as much as 25% faster than the pre-layout estimated delays, depending on how the pre-layout delay calculation is done. This could result in the delay line being too fast. In this case, the design of the individual elements must be adjusted to add an appropriate amount of delay, so that, under best case (fastest) simulation, the total delay in the entire delay line is greater than 1 clock period.

A second design objective is to have fairly consistent delays from tap to tap on the clock bus 21. This is achieved in part by using slightly over-powered elements in each inverting delay element of the delay line 20 to ensure that the effect on the delay caused by variations in the wire load between elements does not have a large effect on the delays between elements.

Figure 3:
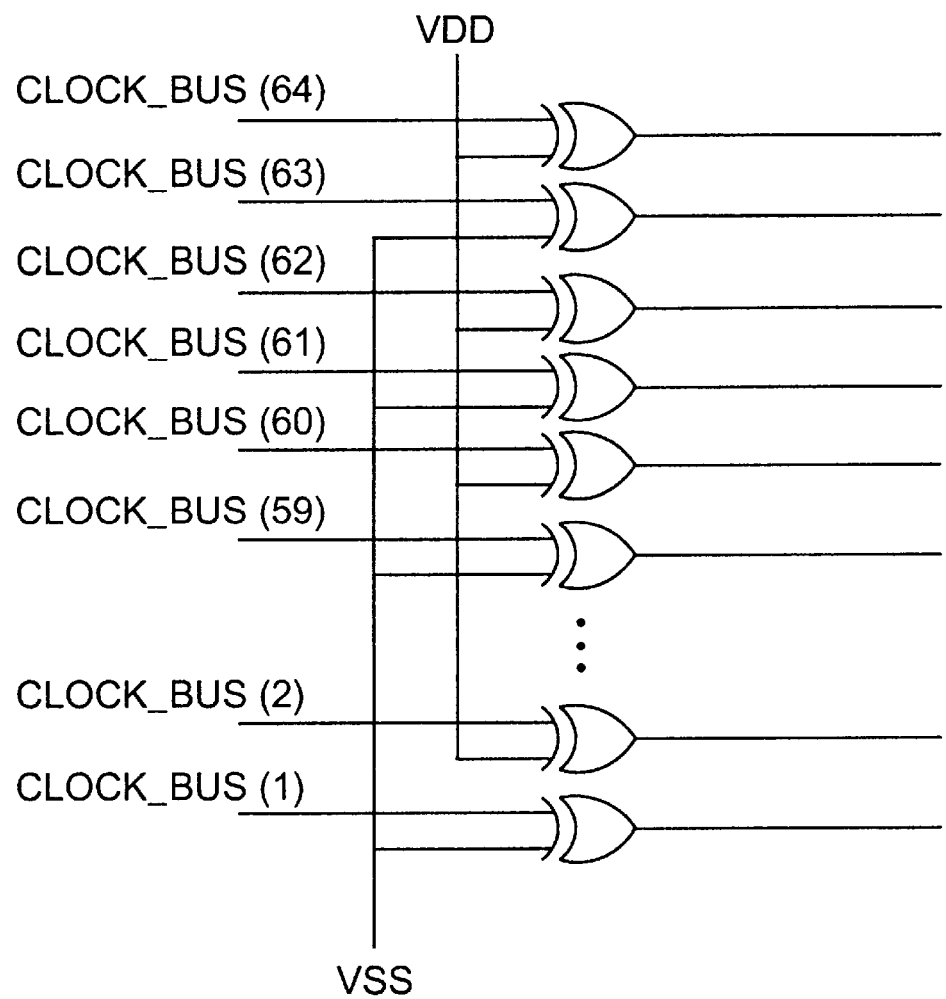
FIG. 3 is a block diagram of a clock reverter of the delay element in FIG. 2.

The clock reverter circuit 22 is used to reinvert every other wire in the 64 bit clock bus 21, so that all signals in the resulting clock bus have the same logic sense. Thus, the delay of each bit must be the same, whether or not an inversion is done. FIG. 3 illustrates the clock reverter 22 in greater detail, employing a plurality of exclusive or gates. This propagation delay through each gate is roughly the same, whether or not there is a signal inversion through the gate or not. As illustrated in FIG. 3, the even bits are inverted, and the odd bits are not inverted.

Figure 4:
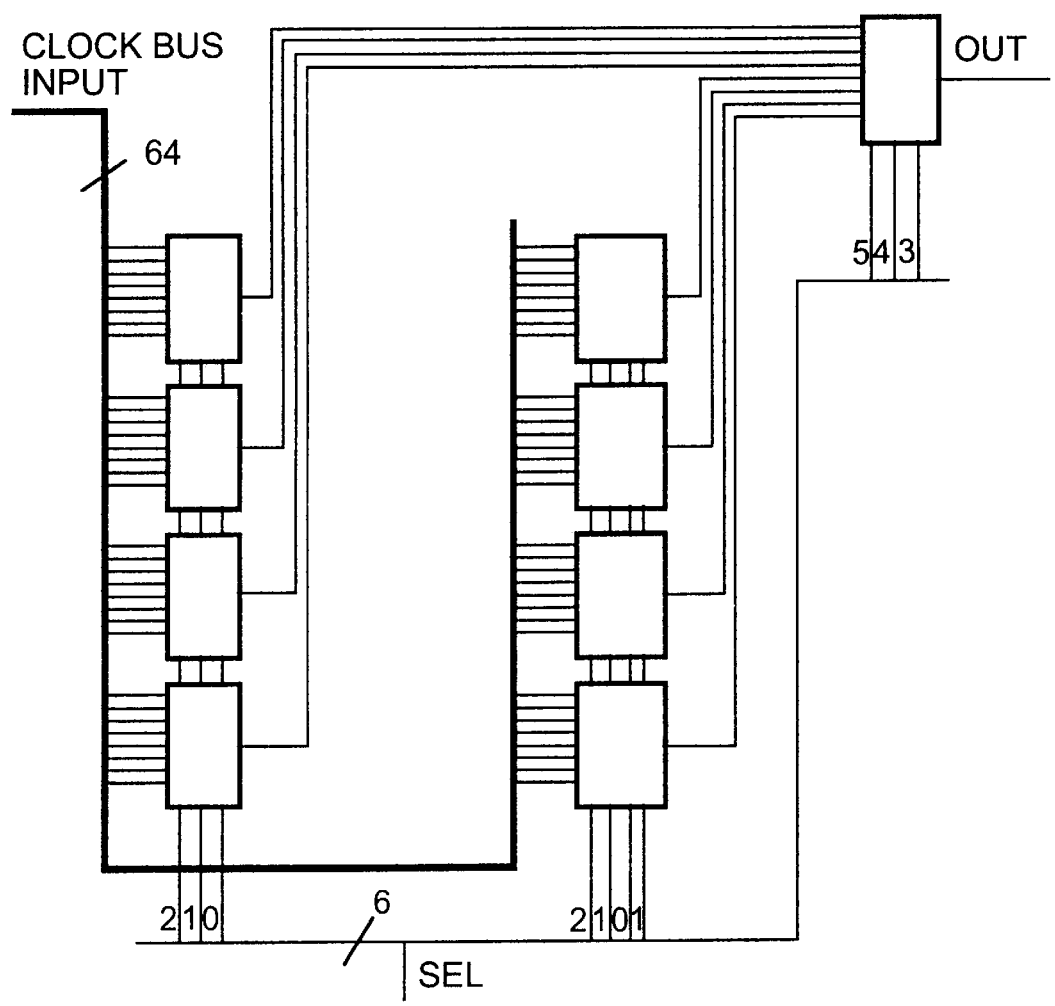
FIG. 4 is a block diagram of a 64 bit to 1 bit multiplexer of the delay element in FIG. 2.

Referring back to FIG. 2, both of the multiplexers 23 and 25 (MUX1 & MUX2), are identical in construction. In order to ensure the same delay from input to output, for all of the 64 clock bus inputs each symmetrical 64 bit multiplexer 23 and 25 is constructed out of smaller 8 bit to 1 bit multiplexers from the ASIC library. Thus, FIG. 4 illustrates the configuration of a 64 to 1 bit multiplexer built out of nine 8 bit to 1 bit multiplexer elements from the ASIC technology library. As discussed in greater detail below with reference to FIG. 7, a "glitch remover" circuit is connected to the output of each of the multiplexers 23 and 25.

The function of the cycle limit extractor 24 is to find the limits of one clock cycle within the delay line, and to provide that information back to the clock phase detector 3 (FIG. 1). The clock phase detector provides incremental changes to the delay adjust input of the programmable delay element 1, depending on the detected clock phase. If the current setting of the delay adjust input is 0, (binary 000000), and a decrement is required, the circuit must know what binary value to set to get the same clock phase after the decrement. The same problem occurs again if the current setting of the delay adjust input is 63, (binary 111111), and an increment is required. The circuit must know what binary value to set to get the same clock phase after the increment. Thus, the cycle limit extractor 24 determines both of these limit numbers. It does this using 64 bit to 1 bit multiplexer 25, MUX2, hooked up in parallel to MUX1, but with a separate 6 bit select input, SELB, and an output, LCLOCK, used as a clock for the cycle limit extractor circuit. It also has a separate tap, Sample A, at the output of INV63, and another separate tap, SampleB, at the output of INV1. A reverter function similar to that shown in FIG. 3, is also applied to SampleA and SampleB in order to normalize the logic sense of these signals. This circuit is not illustrated.

Figure 5:
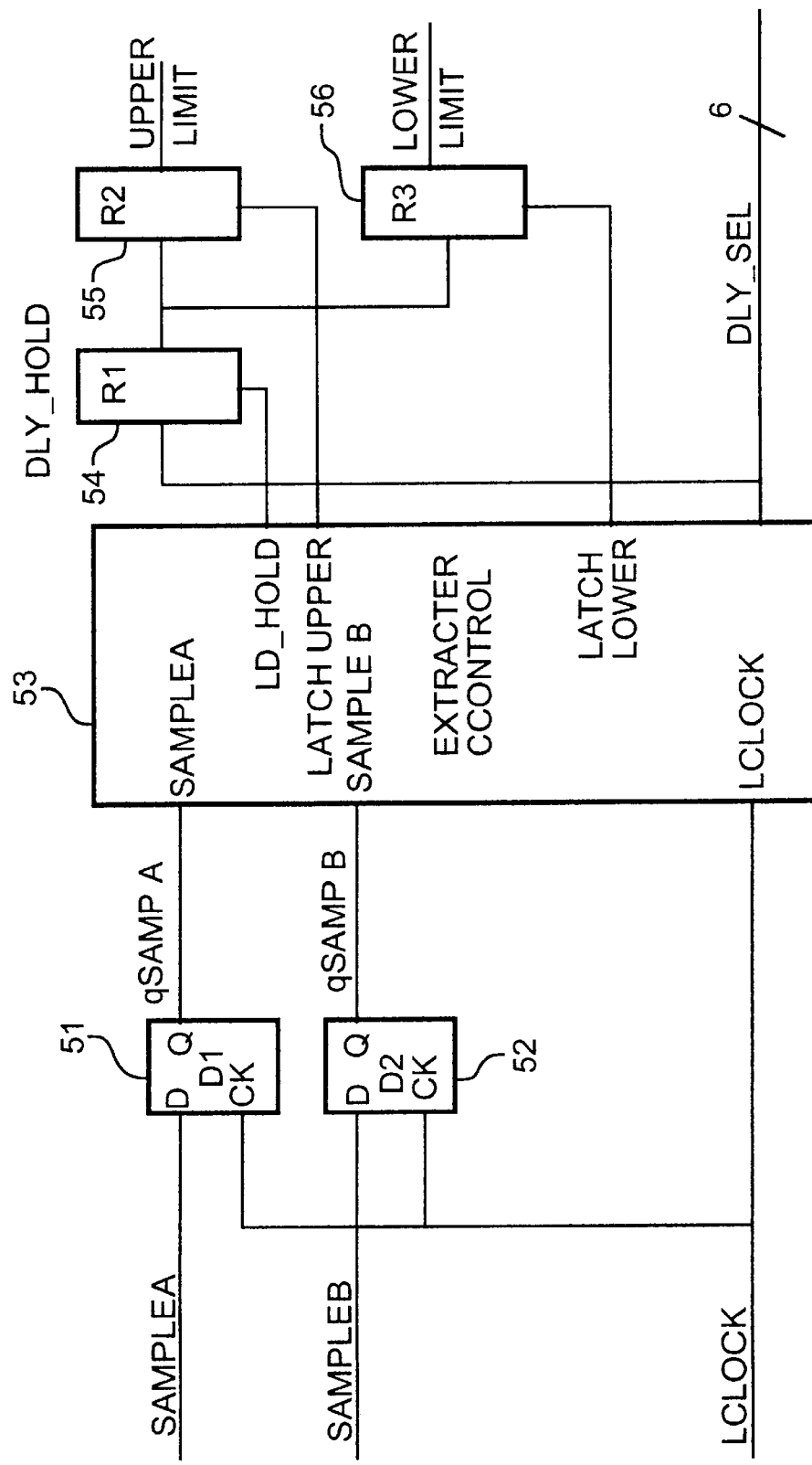
FIG. 5 is a block diagram of a clock limit extractor of the delay element in FIG. 2.

The cycle limit extractor circuit is illustrated in FIG. 5. The LCLOCK input is used to latch the values of SampleA & SampleB into flip-flops 51 and 52 (D1 D2), respectively, on every clock. The latched signals, qSampA & qSampB are fed into the extractor control hardware 53. The extractor control hardware is a finite state machine, (FSM). It has two phases of operation: phase 1 and phase 2. During phase 1, the DLY_SEL output is set to increment on every positive transition of LCLOCK. At the same time, the current value of the qSampB is examined, and compared against the previous value that was saved on the previous clock. If the current value is a logic 0, and the previous value was a logic 1, then the LD_HOLD signal is activated for 1 clock cycle to store the current value of DLY_SEL into register 54 (Ri), the DLY_HOLD register.

When the DLY_SEL value has been incremented all the way up to (hex) 3b or greater, then phase 1 has ended. At the end of phase 1, the LATCH_LOWER signal is activated for 1 clock, and value contained in register 54 (R1), the DLY_HOLD register, is transferred to register 56 (R3), the lower limit register. The extractor control hardware then enters phase 2.

During phase 2, the DLY_SEL output is set to decrement on every positive transition of LCLOCK. At the same time, the current value of qSampA is examined, and compared against the previous value that was saved on the previous clock. If the current value is a logic 0, and the previous value was a logic 1, then the LD_HOLD signal is activated for 1 clock cycle to store the current value of DLY_SEL into the DLY_HOLD register 54 (R1).

When the DLY_SEL value has been decremented all the way down to (hex) 05 or less, then phase 2 has ended. At the end of phase 2, the LATCH_UPPER signal is activated for 1 clock, and the value contained in DLY_HOLD register 54, is transferred to the upper limit register 55 (R2). The extractor control hardware then enters phase 1 again. This phase 1-phase2 sequence repeats endlessly.

The detailed design of the extractor control hardware finite state machine uses straight forward well known and well understood FSM design techniques.

A careful analysis of the digital operation of the cycle limit extractor hardware, based on the algorithm described above shows that when the DLY_SEL output is 0, (the minimum value), the phase of the LCLOCK signal, relative to the input clock, is almost exactly the same as that when the DLY_SEL output is set to the upper limit value. Also, when the DLY_SEL output is (hex) 3F, (the maximum value), the phase of the LCLOCK signal, relative to the input clock, is almost exactly the same as that when the DLY_SEL output is set to the lower limit value.

Based on this fact, a continuous incremental digital phase adjustment can be made to the input clock in any direction provided that:

1. Only single step increments or decrements are made during any clock period,
2. If a decrement is required when the delay adjust input is at its minimum value, then the upper limit value must be the next value loaded,
3. If an increment is required when the delay adjust input is at its maximum value, then the lower limit value must be the next value loaded.

After the chip layout is complete, the circuit can be simulated using actual post route information, and the tap position of SampleA and/or SampleB may be moved, and implemented as an engineering change order (ECO), in order to fine tune the phase alignment of the cycle limit extractor 24.

The cycle limit extractor circuit also provides an unnamed and unillustrated signal to the phase detector 3 used solely for resynchronization, because the two circuits lie on different clock domains. This signal indicates to the phase detector circuit which of the upper or lower limit signals is stable. This signal is trivial to generate. During phase 1, the upper limit is not changing, and during phase 2, the lower limit is not changing.

Figure 6:
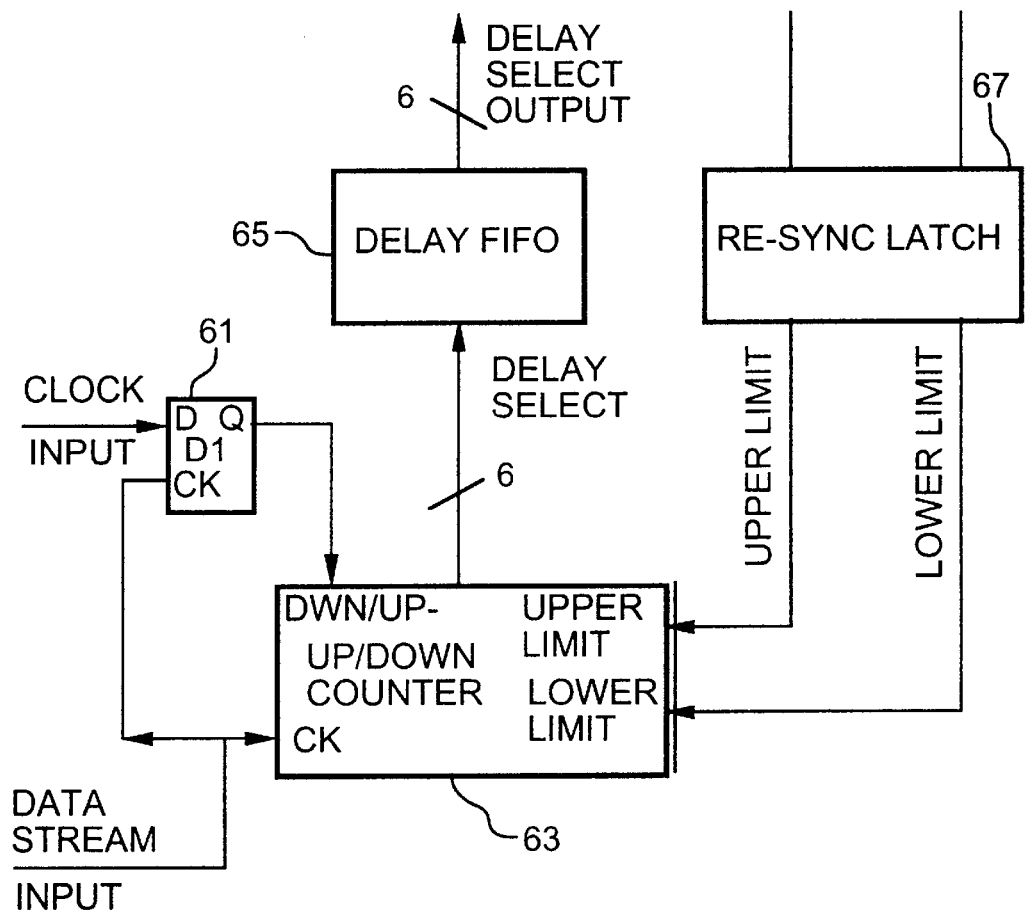
FIG. 6 is a block diagram of a phase detector of the circuit in FIG. 1.

The phase detector 3 is illustrated in greater detail with reference to FIG. 6. A unique feature of the present invention is that the data stream is used as a clock signal to the clock phase detector 3, and the clock input is sampled in flip-flop 61 (D1) by the data stream. The illustrated up/down counter 63 is a well known up/down synchronous counter except that it obeys the three constraints set forth above. The details of this counter design would be well known to a person of skill in the art.

The counter output is stored into a 4 element delay FIFO 65 on every positive transition of the data stream. There are numerous well known configurations available for FIFO memories, any of which may be used in this implementation. The purpose of the FIFO is solely to provide re-synchronization, because the destination of this signal is on a different clock domain.

The delay select output of the delay FIFO 65 is connected to the delay adjust input of the programmable delay element 1 (see FIG. 1.) The programmable delay element circuit reads the next element out of the delay FIFO 65 if one is present. If no new data is in the FIFO, then the previous value is used. The upper and lower limit inputs are provided from the limit extractor circuit 24 of the programmable delay element (see FIGS. 2 & 5)

The re-sync latch 67 is used to latch the upper limit and lower limit of the cycle limit extractor outputs, depending on which one is not changing Resynchronization circuits are fairly well known and well understood, and the exact details of the resynchronization of these signals does not affect the operation of the phase detector.

When a positive transition occurs on the data stream, the clock input is sampled, either high or low. If the sample is high, then the up/down counter 63 counts down on the very next positive transition on the data stream. This decrements the delay select output by one, and slightly reduces the phase of the clock input. If the sample is low, then the up/down counter 63 counts up on the very next positive transition on the data stream. This increments the delay select output by one, and slightly increases the phase of the clock input.

Eventually the up/down counter 63 reaches a point where the clock input is being sampled almost exactly at a positive transition. If a logic 1 is successfully sampled, the delay select will decrement until a logic zero is sampled. Then it will subsequently increment until a logic 1 is sampled. The result is that the positive edge of the input clock will remain lined up with the positive edge of the data stream, thereby accomplishing the objectives of the invention.

It will be understood that this circuit can also use the negative edge of the input clock to sample the data.

Figure 7:
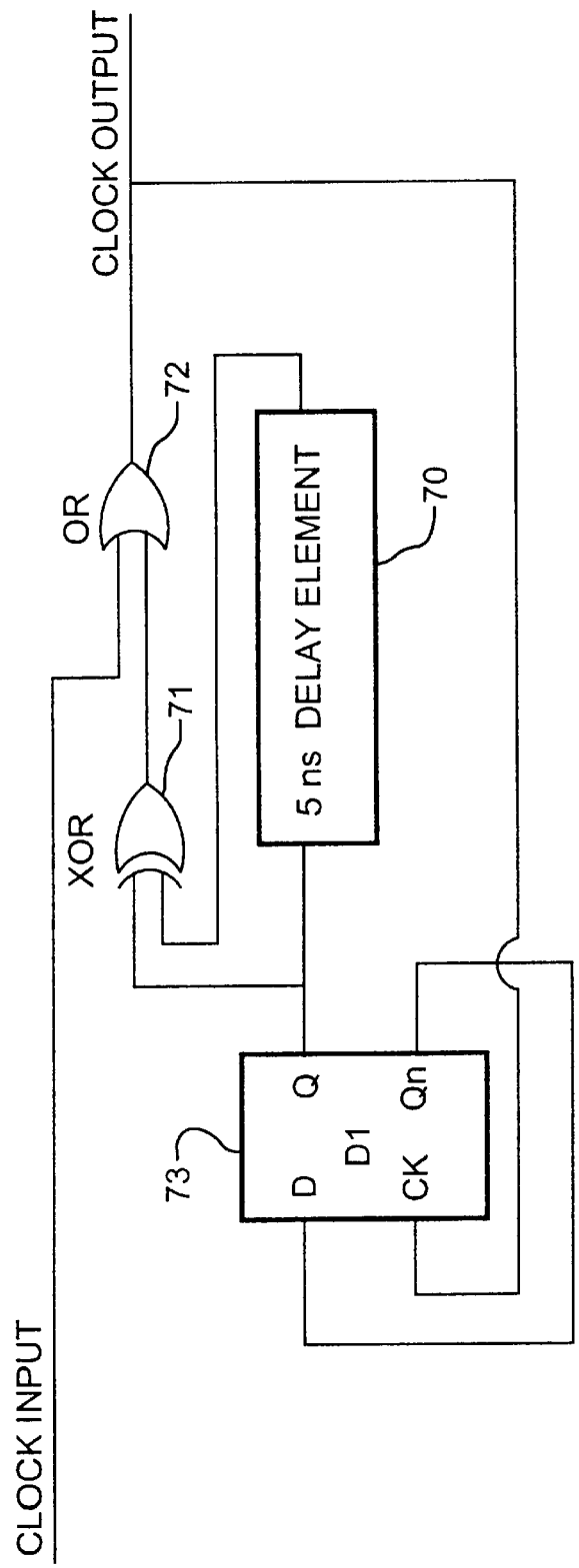
FIG. 7 is a block diagram of clock glitch remover for use with the circuit of FIG. 2.

As discussed briefly above, a "glitch remover" is connected to the clock output of the multiplexers 23 and 25, as shown in FIG. 7. This circuit removes the effects of small glitches on the clock caused by multiple bits changing on the 6 bit binary clock delay select signals at MUX1 and MUX2 select inputs, and any clock phase decrement which reduces the phase beyond the point where the clock happened. The illustrated 5 ns delay element 70 can be constructed out of any delay elements in the ASIC technology library, or out of a string of inverters or buffers. The XOR and OR gates 71 and 72 are typical exclusive OR and OR gates. The flip-flop 73 (D1) is a typical D type flip-flop.

Alternative embodiments and variations of the invention are possible. For example, the programmable delay element 1 may be used in numerous other types of phase locking circuits. It may also be used in frequency generation applications, if the delay is incremented/decremented at regular times and/or at a pre-determined rate. The granularity of the programmable delay element 1 can be increased or decreased, by increasing or decreasing, respectively, the number of clock taps in the delay line 20, and by suitably adjusting the delay value of each of the individual delay elements in the delay line. All of the 6 bit delay counters can be implemented using 'gray' code. This is a popular well known and well understood count sequence where only one bit ever changes. All such alternatives and variations are believed to be within the sphere and scope of the invention as set forth in the claims appended hereto.

What is claimed is:

1. A circuit for generating a data clock signal from timing information provided by an input data stream, comprising:

a programmable delay element for receiving an arbitrary clock signal, delaying said arbitrary clock signal by a variable programmable amount and in response generating an extracted data clock signal; and a clock phase detector for comparing logic level transitions of said input data stream with transitions of said extracted data clock signal and in response generating a delay adjust signal for defining said variable programmable amount of delay such that the transitions of said input data stream are substantially aligned with the transitions of said arbitrary clock signal, wherein said programmable delay element further comprises:

a multi-element delay line for receiving and delaying said arbitrary clock signal, said delay line having a plurality of taps for outputting successively incrementally delayed versions of said arbitrary clock signal;

a first multiplexer for receiving said delay adjust signal and in response selecting one of said taps for outputting said extracted data clock signal; and a cycle limit extractor for receiving least and most incrementally delayed versions of said arbitrary clock signal and in response calculating lower and upper limit values for initializing said clock phase detector to generate a correct delay adjust signal in the event that either said variable programmable amount is to be decremented and said least incrementally delayed version of said arbitrary clock signal is being output by said multi-element delay line or said variable programmable amount is to be incremented and said most incrementally delayed version of said arbitrary clock signal is being output by said multi-element delay line, respectively.

2. The circuit of claim 1, wherein each element of said multi-element delay line comprises an inverter.

3. The circuit of claim 2, further comprising a clock reverter intermediate said multi-element delay line and said first multiplexed for adjusting said successively incrementally delayed versions of said arbitrary clock signal to a common logic sense.

4. The circuit of claim 1, wherein said cycle limit extractor further comprises:

a second multiplexer connected in parallel with said first multiplexer for selecting one of said taps for outputting a limit clock signal; and a finite state machine for receiving said least and most incrementally delayed versions of said arbitrary clock signal and said limit clock signal and in response generating said lower and upper limit values.

5. The circuit of claim 1, wherein said clock phase detector further comprises an up/down counter for sampling said extracted data clock signal on each logic level transition of said input data stream and within said lower and upper limit values decrementing a count value in the event said extracted data clock signal is at a high logic level and incrementing said count value in the event said extracted data clock signal is at a low logic level.

6. The circuit of claim 5, wherein said clock phase detector further includes a delay latch for receiving and outputting to said programmable delay element a delayed version of said count value representing said delay adjust signal.

7. The circuit of claim 4, further comprising a glitch remover circuit connected to the outputs of said first and second multiplexers for correcting minor errors in said extracted data clock signal and said limit clock signal.

* * * * *